(12) United States Patent
Bellis et al.

(10) Patent No.: US 6,828,822 B1
(45) Date of Patent: Dec. 7, 2004

(54) APPARATUS AND METHODS FOR SHARED MEMORY INTERFACES IN PROGRAMMABLE LOGIC DEVICES

(75) Inventors: Andrew J. Bellis, Guildford Surry (GB); Andrew Draper, Chesham Bucks (GB); Kulwinder Dhanoa, London Middlesex (GB)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/678,798

(22) Filed: Oct. 3, 2003

(51) Int. Cl.[7] ............................................. H03K 19/173
(52) U.S. Cl. ........................................ 326/38; 326/41
(58) Field of Search .................................... 326/37–41

(56) References Cited

U.S. PATENT DOCUMENTS 6,581,145 B1 * 6/2003 Lu et al. ...................... 711/167
6,605,960 B2 * 8/2003 Veenstra et al. .............. 326/38

* cited by examiner

*Primary Examiner*—Don Le
(74) *Attorney, Agent, or Firm*—O'Keefe, Egan & Peterman, LLP

(57) ABSTRACT

A programmable logic device (PLD) includes a memory controller. The memory controller includes a first controller that communicates via a shared interface with a first memory external to the PLD. The memory controller also includes a second controller that communicates via the shared interface with a second memory external to the PLD. The PLD further includes an arbitration circuitry. The arbitration circuitry is configured to arbitrate ownership of the shared interface by the first and second controllers.

42 Claims, 7 Drawing Sheets

APPARATUS AND METHODS FOR SHARED MEMORY INTERFACES IN PROGRAMMABLE LOGIC DEVICES

TECHNICAL FIELD

The inventive concepts relate generally to integrated circuit (IC) memory interfaces and, more particularly, to shared memory interfaces in programmable logic devices (PLDs).

BACKGROUND

Modern PLDs often interface with a variety of memory devices. Each type of memory typically uses a particular or specialized interface that complies with the specifications and protocols for that type of memory. Thus, to have the ability to interface with various types of memory, the PLD includes a number of input and output lines for each type of memory.

The specialized or dedicated input and output lines for the various types of memory increase the number of input/output pins for the PLD. Unfortunately, the increase in the number of pins results in larger packages and physical footprints for PLDs. Furthermore, the larger number of pins increases the cost of the PLDs and, hence, the systems within which they reside. A need therefore exists for providing memory interfaces in PLDs that overcome the disadvantages of conventional memory interfaces.

SUMMARY

This invention in contemplates configurable memory interfaces for PLDs. One aspect of the invention relates to apparatus for memory controllers for PLDs. In one illustrative embodiment, a PLD according to the invention includes a memory controller and an arbitration circuitry. The memory controller includes two controllers. One controller is configured to communicate via a shared interface with one memory external to the PLD. The other controller is configured to communicate via the shared interface with another memory external to the PLD. The arbitration circuitry arbitrates ownership of the shared memory interface by the two controllers.

In another illustrative embodiment, a data-processing system according to the invention includes a PLD. The PLD includes two memory controllers and a configurable memory interface. Each memory controller couples to a respective memory external to the PLD. The configurable memory interface is adapted to provide in a selectable manner a shared memory interface. The shared memory interface is configured to provide communication between the memory controllers and the respective external memories.

Another aspect of the invention concerns methods of processing information. In one illustrative embodiment, a method of processing information using a PLD includes communicating via a shared interface with a memory. The memory is external to the PLD. The method also includes communicating via the shared interface with another memory that is external to the PLD. The method further includes arbitrating ownership of the shared interface by the controllers.

DESCRIPTION OF THE DRAWINGS

The appended drawings illustrate only exemplary embodiments of the invention and therefore should not be considered as limiting its scope. The disclosed inventive concepts lend themselves to other equally effective embodiments. In the drawings, the same numeral designators used in more than one drawing denote the same, similar, or equivalent functionality, components, or blocks.

DETAILED DESCRIPTION

This invention contemplates apparatus and associated methods for shared memory interfaces in PLDs. The memory interfaces according to the invention provide several advantages over conventional memory interfaces. The advantages include lower pin-count for PLDs that include the interfaces, lower foot-print (or board space that the PLD takes up), lower board space that interconnects (e.g., printed circuit board traces) use. As a result, circuits and systems that use such PLDs have relatively low cost and relatively high reliability because of reduced complexity of the interconnects.

In one type of PLD according to the invention, the PLD uses a shared memory interface to communicate with at least two types of memory. The shared memory interface in this type of PLD provides the advantages described above.

Because of their flexibility, the inventive concepts can provide configurable memory interfaces to the user, as desired. Thus, another type of PLD according to the invention provides an option to the user of having shared or non-shared memory interfaces.

In other words, this type of PLD includes provisions for both shared and non-shared memory interfaces. The user has the option of using shared memory interfaces and therefore reaping the advantages described above. In this mode, the user may use the pins and coupling mechanisms saved because of the interface sharing for other purposes, such as general-purpose I/O, etc.

The user, however, has the option of using non-shared memory interfaces. In this mode, the PLD uses one memory interface to communicate with one type of memory, and another memory interface to communicate with another type of memory. The option of using either type of interface (shared or non-shared) provides the user with increased flexibility.

Figure 1:
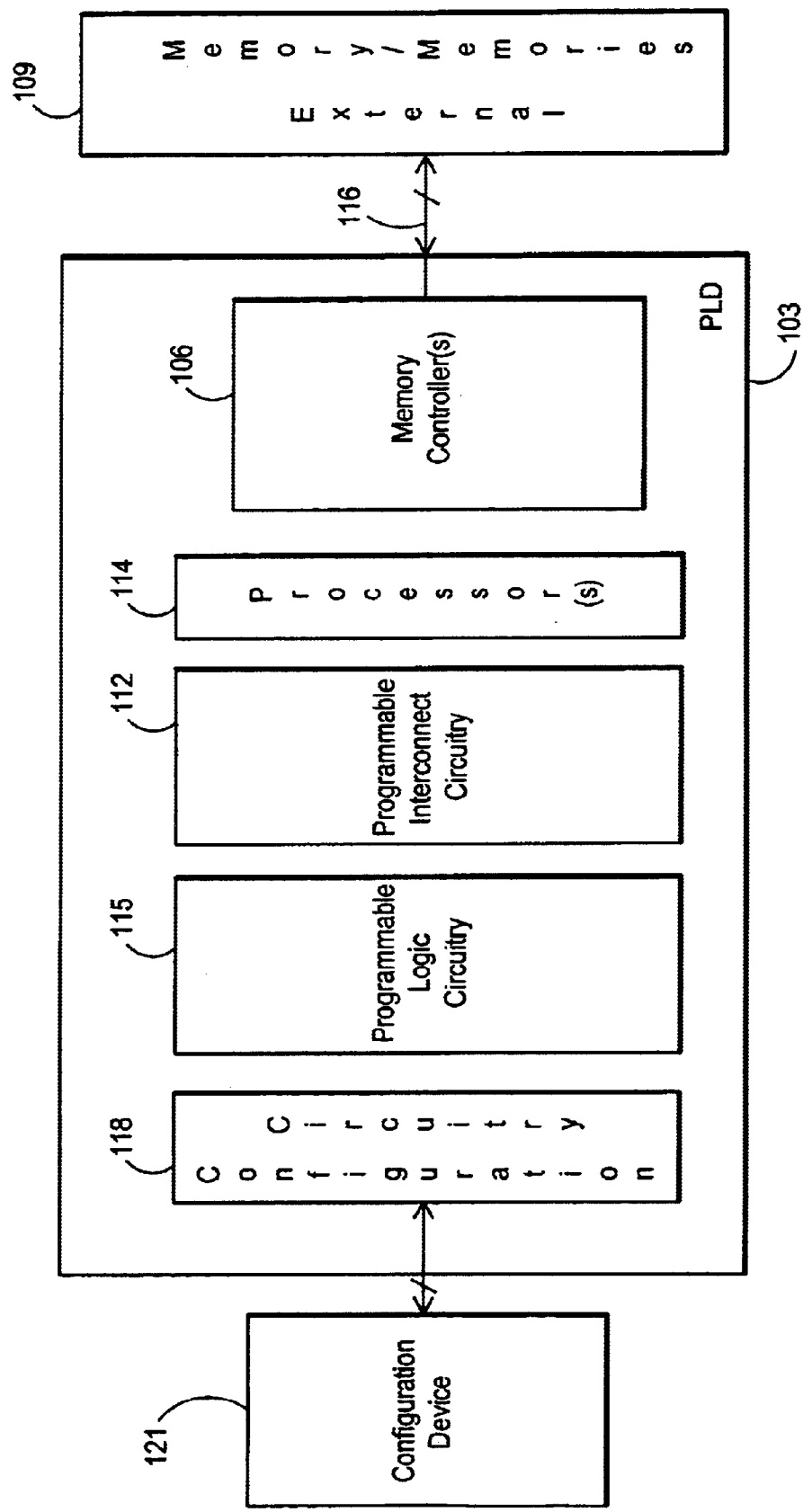
FIG. 1 shows a general block diagram of a PLD according to an illustrative embodiment of the invention.

FIG. 1 shows a general block diagram of a PLD 103 according to an illustrative embodiment of the invention. PLD 103 includes configuration circuitry 118, programmable logic circuitry 115, programmable interconnect circuitry 112, and one or more processors 114.

Note that FIG. 1 shows a simplified block diagram of PLD 103. Thus, PLD 103 may include other blocks and circuitry, as persons of ordinary skill in the art understand. Examples of such circuitry include clock generation and distribution circuits, communication circuitry and/or controllers (e.g., network controllers), input/output (I/O) circuitry, test/debug circuitry, and the like.

Programmable logic circuitry 115 includes blocks of configurable or programmable logic circuitry, such as look-up tables (LUTs), product-term logic, multiplexers, logic gates, registers, memory, and the like. Programmable interconnect circuitry 112 couples to programmable logic circuitry 115 and provides configurable interconnects (coupling mechanisms) among various blocks within programmable logic circuitry 115 and other circuitry within or outside PLD 103, as desired.

PLD configuration circuitry 118 uses configuration data (which it obtains from an external source, such as a storage device, a host, etc., generally shown as configuration device 121) to program or configure the functionality of PLD 103. The configuration data determine the functionality of PLD 103 by programming programmable logic circuitry 115, programmable interconnect circuitry 112 (and other parts of PLD 103, as desired), as persons skilled in the art with the benefit of the description of the invention understand.

As noted above, PLD 103 may include one or more processors 114. Processor(s) 114 may couple to other blocks and circuits within or external to PLD 103. Processor(s) 114 may receive data and information from circuits within or external to PLD 103 and process the information in a wide variety of ways, as persons skilled in the art with the benefit of the description of the invention appreciate.

Memory controller(s) 106 communicate with external memory or memories 109 via link 116. Memory controller(s) 106 facilitate communication with external memory or memories 109, as persons of ordinary skill in the art who have the benefit of the description of the invention understand. More specifically, memory controller(s) 106 provide control and status signals (not shown explicitly) to, and receive status and control signals from, external memory/memories 109.

In addition, memory controller(s) 106 may provide signals (write data) to, and/or receive signals (read data) from, external memory/memories 109. The type, number, and functionality of the signals in link 116 depends on the type of memory/memories 109 to which it couples, as persons of ordinary skill in the art with the benefit of the description of the invention understand.

Memory controller(s) 106 can communicate with a wide variety of memories, as desired. Examples include random-access memories (RAMs), dynamic RAM (DRAM), synchronous DRAM (SDRAM), magnetic RAM (MRAM), static RAM (SRAM), FLASH, read-only memory (ROM), programmable ROM (PROM), erasable PROM (EPROM), etc. The ability to communicate with various types of memory allows use of PLD 103 in flexible, powerful data-processing systems and circuitry.

Figure 2:
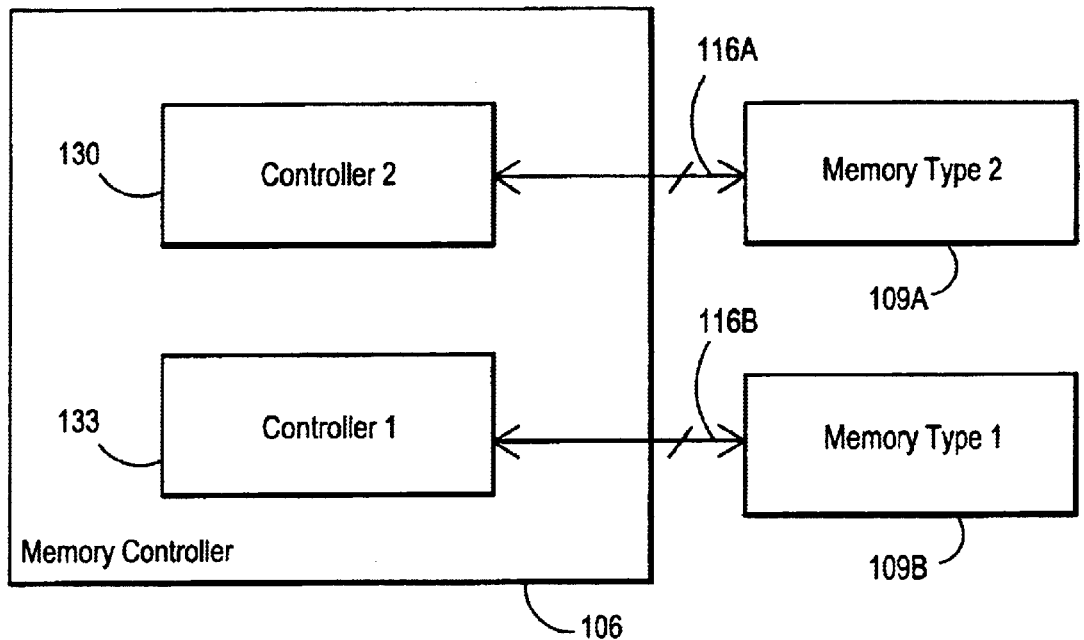
FIG. 2 illustrates a block diagram of a memory controller according to an exemplary embodiment of the invention.

FIG. 2 provides a block diagram of a memory controller 106 according to an exemplary embodiment of the invention. Memory controller 106 includes two memory controllers. The first controller, memory controller 1 (labeled 133) controls one type of memory, whereas the second controller, memory controller 2 (labeled 130), controls another type of memory.

Memory controller 133 allows memory controller 106 and, hence, PLD 103, to communicate with memory/memories 109B (one or more modules, blocks, integrated circuits, etc., as desired) via link 116B. Link 116B communicates status, control, and data signals between controller 133 and memory/memories 109B, as persons of ordinary skill in the art who have the benefit of the description of the invention understand.

Similarly, memory controller 130 provides a mechanism for memory controller 106 and, consequently, PLD 103, to communicate with memory/memories 109A (one or more modules, blocks, integrated circuits, etc., as desired). Persons of ordinary skill in the art recognize a type or subset of memory/memories 109A as memories (e.g., ROMs) that use chip-select or chip-enable type of interfaces. Link 116A communicates status, control, and data signals between memory controller 130 and memory/memories 109A, as persons of ordinary skill in the art who have the benefit of the description of the invention understand.

Memories 109A and 109B may each constitute one or more memories of a given type, as desired. By selecting memory types 1 and 2 (memories 109B and 109A, respectively), one may communicate between memory controller 106 (and hence PLD 103) and a wide variety of memory types and configurations.

For example, in one embodiment according to the invention, memory 109A may constitute one or more non-RAM memories, such as ROM, whereas memory 109B may constitute one or more SDRAMs. In another illustrative embodiment according to the invention, memory 109A may constitute one or more SRAMs, whereas memory 109B may constitute one or more SDRAMs.

In yet another exemplary embodiment according to the invention, memory 109B may constitute one or more DRAMs, SDRAMs, or synchronous FLASH memories. Memory 109A may constitute one or more SRAMs, non-synchronous FLASH memories, ROMs, PROMs, or EPROMs. Persons of ordinary skill in the art who have the benefit of the description of the invention understand that the embodiments described are exemplary embodiments and that one may use other varieties and combinations of various memory types as memory 109A and memory 109B.

Figure 3:
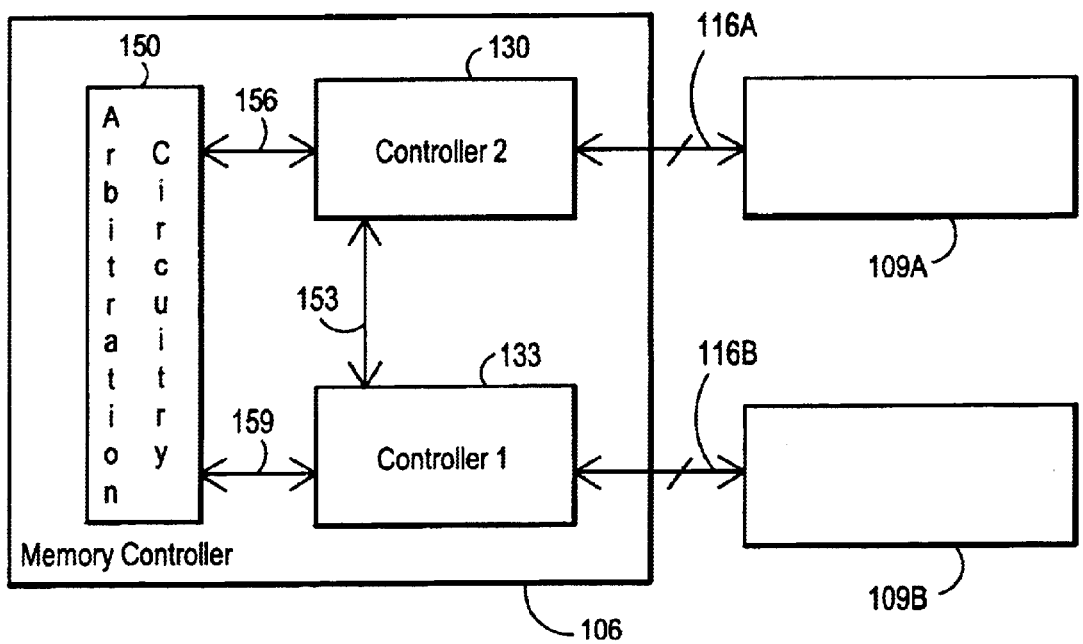
FIG. 3 depicts a block diagram of memory controller according to another exemplary embodiment of the invention.

FIG. 3 shows a block diagram of memory controller 106 according to another exemplary embodiment of the invention. Memory controller 106 includes arbitration circuitry 150. Arbitration circuitry 150 communicates with controller 133 via signal link 159, which may include one or more of each of status signals, control signals, etc.

Similarly, arbitration circuitry 150 communicates with controller 130 via signal link 156. Signal link 156 may include one or more of each of status signals, control signals, etc. Note that signal link 156 and signal link 159 may share one or more signals (for example, a common control or status signal), as persons of ordinary skill in the art with the benefit of the description of the invention understand.

Arbitration circuitry 150 controls access to or ownership of the shared memory interface. More specifically, arbitration circuitry 150 controls which of controller 130 and controller 133 has ownership or control of, or access to, the shared memory interface and for how long.

Controller 130 and controller 133 may couple together and communicate via signal link 153, as desired. Through signal link 153, controller 130 and controller 133 may communicate signals to each other that need not route through arbitration circuitry 150.

Note that the embodiment in FIG. 3 uses two interfaces. Stated another way, controller 130 and controller 133 use two interfaces to communicate with memories 109A and 109B. More specifically, controller 130 uses signal link 116A to communicate with memory/memories 109A. Controller 133, however, uses signal link 116B to communicate with memory/memories 109B.

Note that memory controller 106 in FIG. 3 includes two memory interfaces 116A and 116B. Signal links 116A and 116B may share some signals. In other words, some of the signals in signal link 116A and signal link 116B may constitute a shared memory interface (not shown explicitly in the figure). Thus, the user may use memory controller 106 in non-shared mode or in shared mode, as desired.

Figure 4:
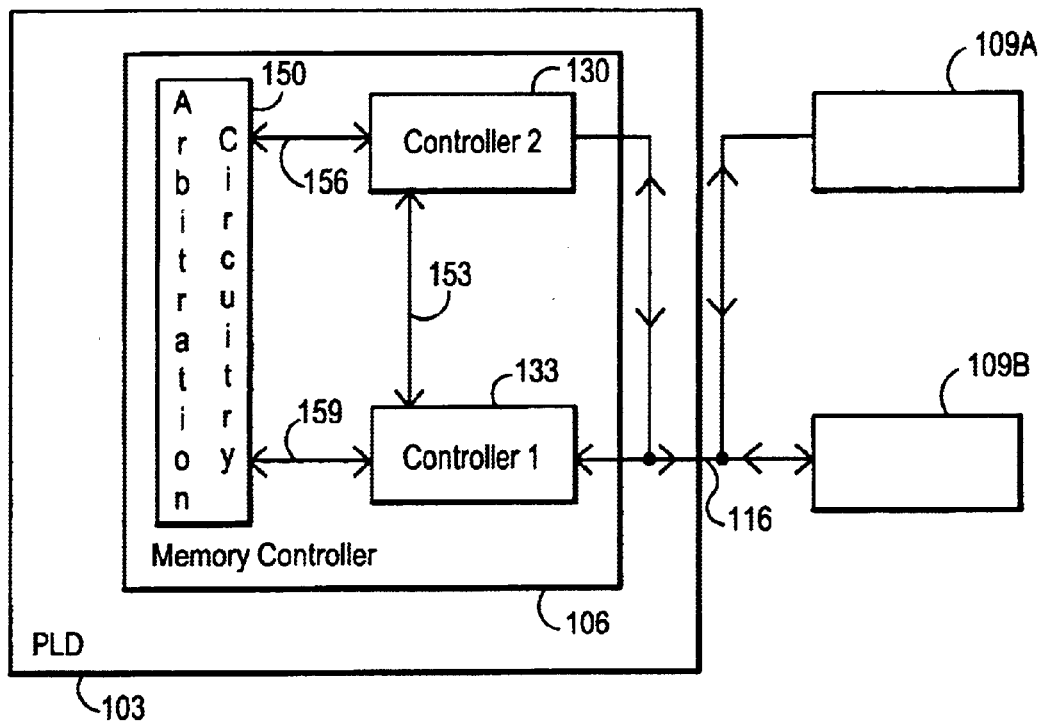
FIG. 4 shows a block diagram of a memory controller according to the invention used in a shared mode of operation.

FIG. 4 illustrates a block diagram of memory controller 106 according to the invention used in a shared mode of operation. Conceptually, memory controller 106 may correspond to a dual-mode (i.e., shared and non-shared) memory controller, or a single-mode, shared-interface memory controller.

Referring to FIG. 4, controller 130 and controller 133 use a shared memory interface. More specifically, controller 130 uses signal link 116 to communicate with memory/memories 109A. Similarly, controller 133 uses signal link 116 to communicate with memory/memories 109B. Signal link 116 constitutes a shared memory interface and includes one or more of status, control, and data signal lines.

Note that, depending on various factors, controller 130 and controller 133 may have differing complexity and functionality. The factors include the type of memory used as memory 109A and memory 109B, the data-processing tasks that the user desires to perform, system design and performance specifications, and the like. Depending on those factors, one may implement memory controller 106 in a variety of ways, as persons of ordinary skill in the art who have the benefit of the description of the invention understand.

Figure 5:
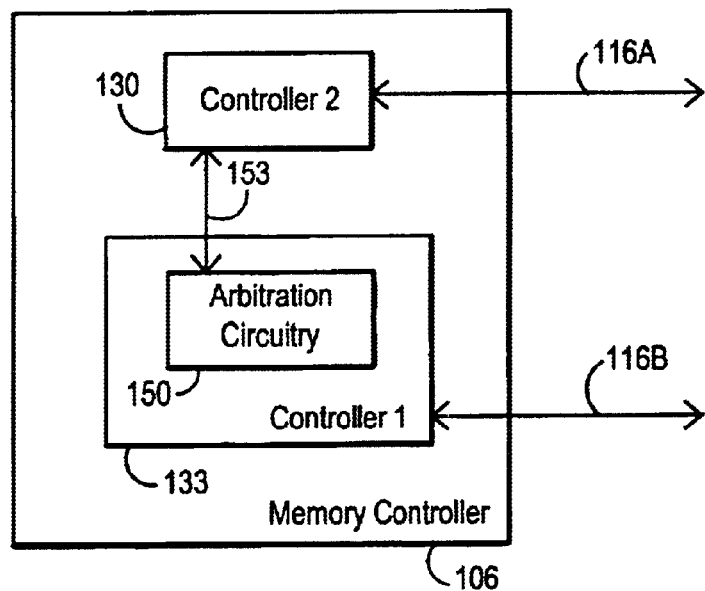
FIG. 5 illustrates a block diagram of a memory controller according to another illustrative embodiment of the invention.

As an example, one may include arbitration circuitry 150 within controller 133, as desired. FIG. 5 depicts a memory controller 106 that includes such a configuration. Signal link 153 allows communication between controller 130 and arbitration circuitry 150, controller 133, or both. Persons skilled in the art with the benefit of the description of the invention understand that, in alternative embodiments, one may include arbitration circuitry 150 within controller 130, as desired.

Controller 130 and controller 133 use two interfaces to communicate with memories 109A and 109B. More specifically, controller 130 uses signal link 116A to communicate with memory/memories 109A. Controller 133, however, uses signal link 116B to communicate with memory/memories 109B. Signal links 116A and 116B may share some signals. In other words, some of the signals in signal link 116A and signal link 116B may constitute a shared memory interface. One may operate memory controller 106 in either shared or non-shared mode, as desired.

Figure 6:
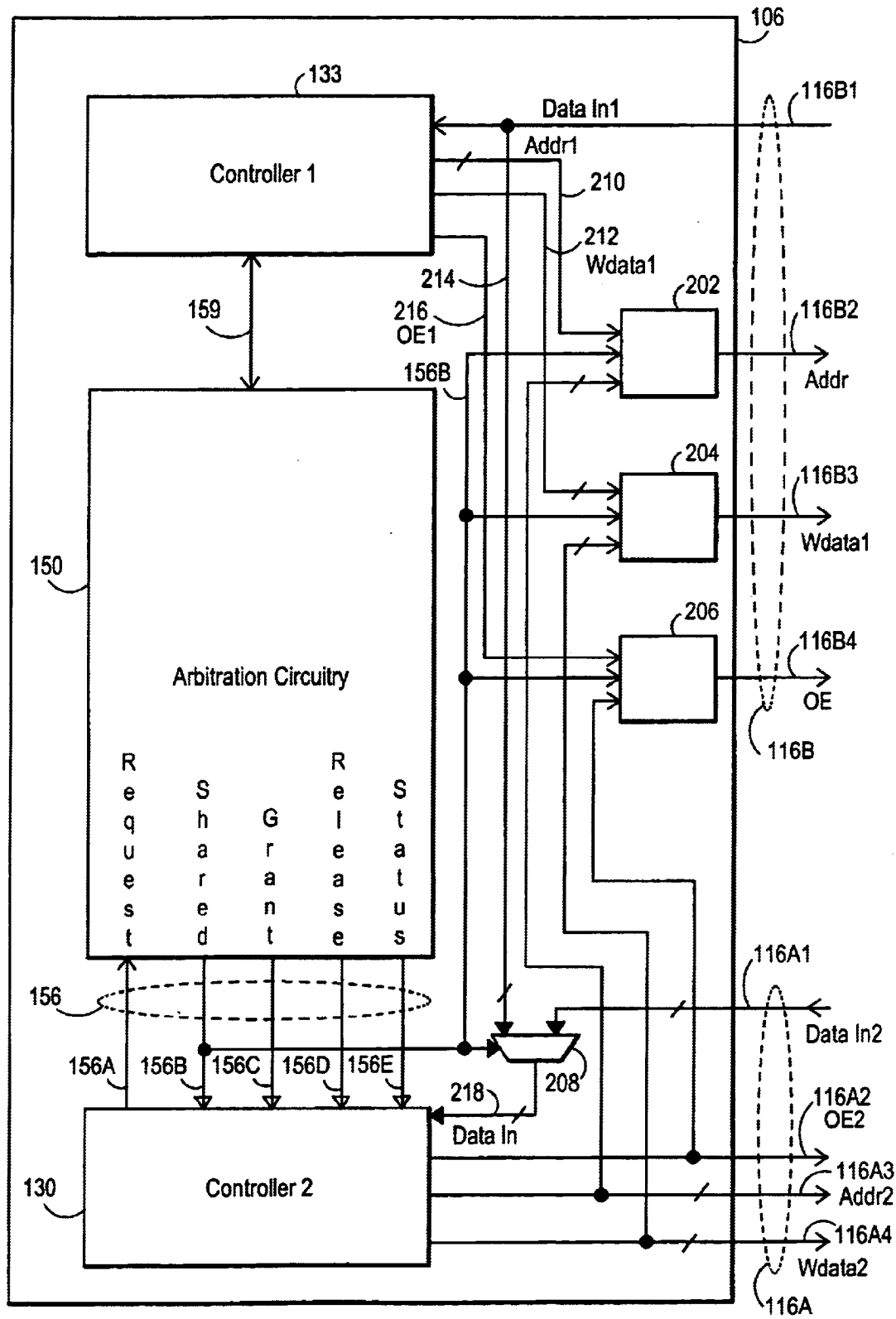
FIG. 6 depicts a more detailed block diagram of an illustrative embodiment of a memory controller according to the invention.

FIG. 6 shows a more detailed block diagram of an illustrative embodiment of a memory controller 106 according to the invention. As one option, one may use controller 106 in FIG. 6 as a controller capable of communicating with memories using two memory interfaces (ie., using signal link 116A and signal link 116B). As another option, one may use controller 106 as a memory controller that, according to the user's programming of PLD 103 (not shown in FIG. 6) can communicate with memories by using a shared memory interface (i.e., by using signal link 116B) or by using two memory interfaces (i.e., using signal link 116A and signal link 116B).

Controller 106 uses signal select circuit 202, signal select circuit 204, and signal select 206 to provide a shared interface via signal link 116B. More specifically, depending on the logical state of signal 156B (labeled "Shared"), signal select circuit 202, signal select 204, and signal select 206 provide to signal link 116B memory interface signals that they receive from memory controller 130 and memory controller 133. The circuitry for memory controller 106 assumes that controller 130 or controller 133 uses the shared memory interface if arbitration circuitry 150 has granted use of the shared interface to the respective controller.

Signal select circuit 202 provides memory address signals via signal link 116B. More specifically, signal select circuit 202 receives address signals Addr1 from controller 133 via address signal link 210. Signal select circuit 202 also receives address signals Addr2 from controller 130 via address signal link 116A3. Depending on the logic state of Shared signal 156B, signal select circuit 202 provides as address signals 116B2 either address signals Addr1 or address signals Addr2.

Signal select circuit 204 provides memory write data signals via signal link 116B. Stated in more detail, signal select circuit 204 write data signals WData1 from controller 133 via data signal link 212. Signal select circuit 204 further receives write data signals WData2 from controller 130 via data signal link 116A4. Based on the logic state of Shared signal 156B, signal select circuit 204 provides as write data signals 116B3 either write data signals WData1 or write data signals WData2.

Signal select circuit 206 provides a memory output-enable signal via signal link 116B. More specifically, signal select circuit 206 receives output-enable signal OE1 from controller 133 via signal link 216. Signal select circuit 206 also receives output-enable signal OE2 from controller 130 via signal link 116A2. Depending on the logic state of Shared signal 156B, signal select circuit 206 provides as output-enable signal 116B4 either output-enable signal OE1 or output-enable signal OE2.

Multiplexer (MUX) 208 provides a mechanism for routing to controller 130 data read from the memory/memories via the shared memory interface. MUX 208 receives memory read data signals via signal link 116A and via signal link 116B. More specifically, MUX 208 receives read data signals Data In1 from controller 133 via data signal link 116B1. MUX 208 further receives read data signals Data In2 from controller 130 via data signal link 116A1. Based on the logic state of Shared signal 156B, MUX 208 provides as read data signals 218 (Data In) either read data signals Data In1 or read data signals Data In2.

Table 1 below summarizes the operation of signal select circuit 202, signal select circuit 204, signal select circuit 206, and MUX 208. More specifically, Table 1 lists the values of the Addr, WData, Data In, and OE signals based on the logic state of Shared signal 156B:

TABLE 1

| Shared | Addr  | WData  | Data In  | OE  |
|--------|-------|--------|----------|-----|
| 0      | Addr1 | WData1 | Data In1 | OE1 |
| 1      | Addr2 | WData2 | Data In2 | OE2 |

Persons of ordinary skill in the art who have the benefit of the description of the invention understand, however, that one may invert the logic values of Shared signal 156B in Table 1, as desired. One may do so by making modifications to the circuitry shown and described here. Such modifications fall within the knowledge of persons skilled in the art with the benefit of the description of the invention.

Arbitration circuitry 150 uses and communicates a variety of control and status signals in its operation. Through signal links 156 and 159, arbitration circuitry 150 may provide the information to controller 130 and controller 133 or receive the information from them.

More specifically, arbitration circuitry 150 accepts Request signal 156A from controller 130. Through Request signal 156A, controller 130 may indicate to arbitration circuitry 150 that it seeks access to the shared memory interface.

Arbitration circuitry 150 may use Grant signal 156C to signal to controller 130 that it has granted access to the shared interface to controller 130. In other words, arbitration circuitry 150 may use Grant signal 156C to indicate to a controller that it may drive signals in the shared memory interface.

Through Release signal 156D, arbitration circuitry 150 may request that controller 130 relinquish the shared memory interface (for example, when controller 133 seeks access to the shared memory interface). Arbitration circuitry 150 may use Release signal 156D to cause a controller to end a memory transaction as soon as possible. Put another way, arbitration circuitry 150 asserts Release signal 156D before it de-asserts Grant signal 156C. Arbitration circuitry 150 de-asserts Grant signal 156C once controller 130 has released the shared interface via Request signal 156A.

Arbitration circuitry 150 uses Shared signal 156B to coordinate operation of the shared memory interface, as described above. Arbitration circuitry 150 may further use Status signal 156E to provide desired status information to controller 130. The status information may constitute virtually any desired information about controller 133, arbitration circuitry 150, the shared memory interface, the attached memory/memories, and the like. For example, through Status signal 156E, arbitration circuitry 150 may indicate to controller 133 has not yet initialized the memory/memories coupled to signal link 116B.

Signal link 159 may have similar signals to signal link 156, as desired. Thus, through signal link 159, arbitration circuitry 150 may communicate a variety of status and control information with controller 133.

In some circumstances, the user may seek to use a single, non-programmable memory interface that uses a single memory interface. By omitting certain elements from controller 106, it can function as a memory controller that communicates with memories using a single interface. More specifically, one may omit signal link 116A and use signal link 116B as a shared interface. Furthermore, one may omit MUX 208 and provide data signals DataIn 1 to controller 130.

Figure 7:
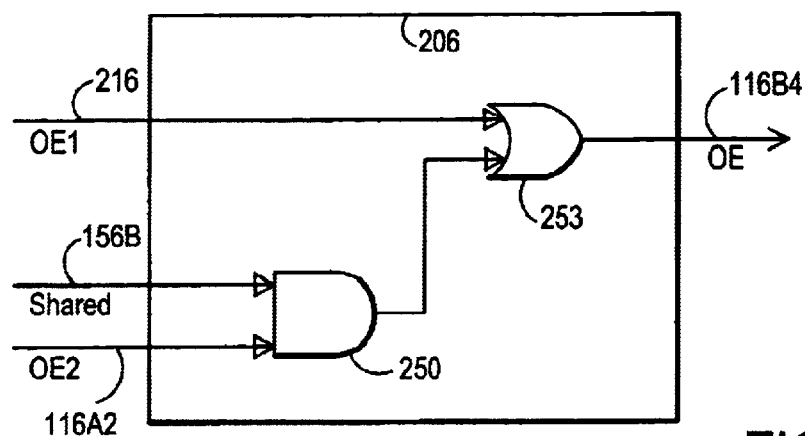
FIG. 7 shows a schematic diagram of a signal select circuit according to the invention.

FIG. 7 illustrates more details of signal select circuit 206. Signal select circuit 206 includes AND gate 250 and OR gate 253. AND gate 250 receives Shared signal 156B and OE2 signal 116A2. The output of AND gate 250 drives one input of OR gate 253. The other input of OR gate 253 receives OE1 signal 216.

Signal select circuit 206 operates as follows. If Shared signal 156B has a low logic value (i.e., indicating a non-shared memory interface), then AND gate 250 produces a low logic value at its output. The output of OR gate 253 reflects the logic value of OE1 signal 216. In other words, if Shared signal 156B has a low logic value, then OE1 signal from controller 133 drives OE signal 116B4. In effect, controller 133 uses the shared interface exclusively.

In the non-shared mode of operation, arbitration circuitry 150 does not grant access to signal link 116B to controller 130. As a result, controller 130 produces a logic value as OE2 signal 116A2. Controller 130 may use signal link 116A1 as a non-shared memory interface.

On the other hand, if Shared signal 156B has a high logic value (i.e., indicating a shared memory interface), then the output signal of AND gate 250 reflects changes in OE2 signal 116A2. If arbitration circuitry 150 grants access to or ownership of the shared memory interface (i.e., signal link 116B) to controller 130, then controller 133 provides a logic low value as OE1 signal 216 and controller 130 may drive OE signal 116B4 via AND gate 250 and OR gate 253. If arbitration circuitry 150 grants access to or ownership of the shared memory interface to controller 133, then controller 130 provides a logic low value as OE2 signal 116A2 and controller 133 may drive OE signal 116B4 through OR gate 253.

Figure 8:
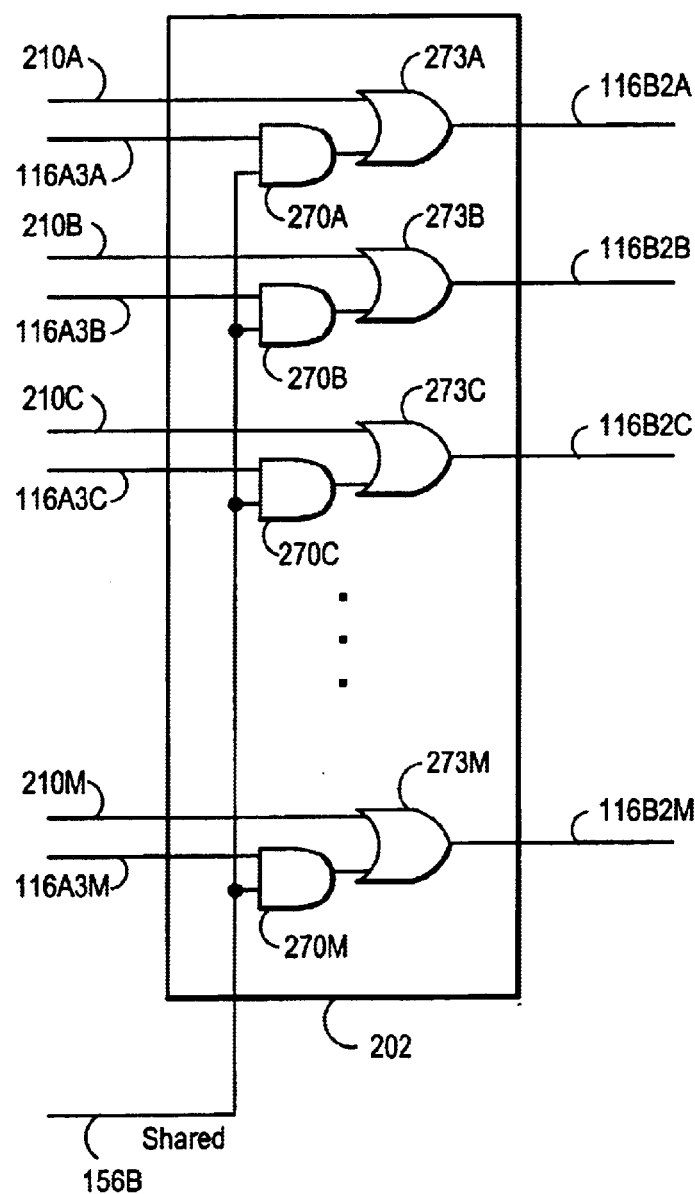
FIG. 8 illustrates a schematic diagram of another signal select circuit according to the invention.

FIG. 8 depicts more details of signal select circuitry 202. Persons of ordinary skill in the art who have the benefit of the description of the invention understand that signal select circuitry 202 operates similarly to signal select circuit 206, except that it selects multi-bit signals. More specifically, signal select circuit 202 includes a plurality of AND gates 270A–270M and a corresponding plurality of OR gates 273A–273M, where M denotes the number of memory address bits.

Depending on the mode of operation (shared vs. non-shared), each of AND gates 270A–270M and a corresponding one of OR gates 273A–273M selects one bit of the memory address bits provided by controller 130 and controller 133. Signal select 202 provides the selected address bit as a corresponding bit of the address bit of Addr signal 116B2.

Depending on the arrangement of the memories used, one may use some of the address bits for bank selection, as desired. More specifically, if one uses memories arranged in banks, one may use some of the address bits to select a particular bank, as persons skilled in the art with the benefit of the description of the invention understand. For example, one may use signal 116B2A and signal 116B2B to select one of four banks.

Note that one may use a circuit similar to the circuit in FIG. 8 to implement signal select 204, as persons of ordinary skill in the art who have the benefit of the description of the invention understand. More specifically, one may arrange an appropriate number of AND gates and OR gates to select memory write data and provide the selected data as WData signals 116B3. In this situation, the respective bits of WData1 signal 212 and WData2 signal 116A4 and Shared signal 156B drive the inputs of the AND and OR gates.

One may implement memory controller 106 and its constituent blocks in a variety of ways or make modifications to the embodiments shown and described here. For example, rather than using signal select circuits 202, 204, and 206, one may use multiplexers or tri-state logic gates or circuits, as desired.

As another example, one may use a signal select circuit (similar to signal select circuit 202 or signal select circuit 204) or tri-state logic gates or circuits instead of MUX 208, as desired. Those examples and other designs and/or modifications fall within the knowledge of persons skilled in the art with the benefit of the description of the invention.

Figure 9:
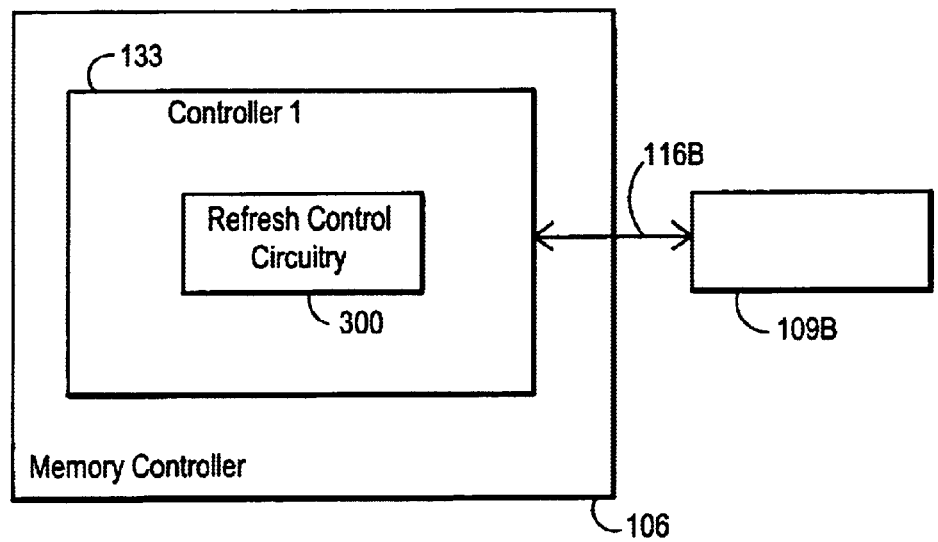
FIG. 9 depicts a block diagram of an exemplary embodiment of a controller according to the invention that includes a refresh control circuitry.

As noted above, one may use the inventive concepts to provide an interface to dynamic RAM (e.g., SDRAM) types of memory. Those memories typically use a periodic refresh operation or cycle to avoid loss of stored data Memory controllers according to the invention may include a refresh circuitry to facilitate performing the refresh operation, as desired. FIG. 9 illustrates a block diagram of an exemplary embodiment of memory controller 133 according to the invention that includes a refresh control circuitry 300.

Refresh control circuitry 300 communicates with memory/memories 109B via signal link 116B. In conjunction with arbitration circuitry 150, refresh control circuitry 300 refreshes DRAM types of memory at desired, scheduled, or specified intervals or time periods.

Figure 10:
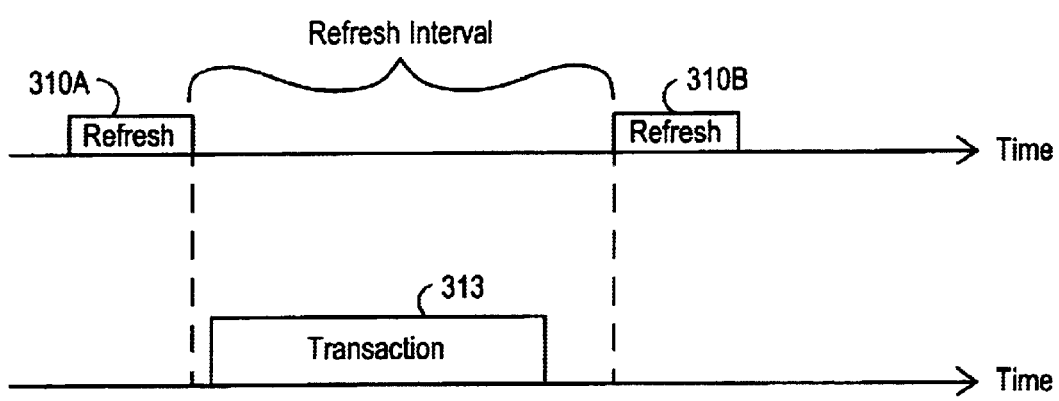
FIG. 10 shows an example of a refresh operation for a memory.

If at the time of the desired refresh operation controller 133 owns the shared interface, arbitration circuitry allows controller 133 to proceed to issue appropriate refresh signal (s) or command(s) to memory/memories 109B without a conflict. FIG. 10 shows an example of a situation where controller 133 may cause an appropriate refresh operation to commence without a conflict. Refresh operation 310A takes place at a given or desired time period. Refresh operation 310B, separated by a refresh interval from refresh operation 310A, constitutes the next desired or scheduled refresh operation. Memory transactions may take place during the refresh interval. For example, controller 130 may use the shared interface to conduct memory transaction 313.

Figure 11:
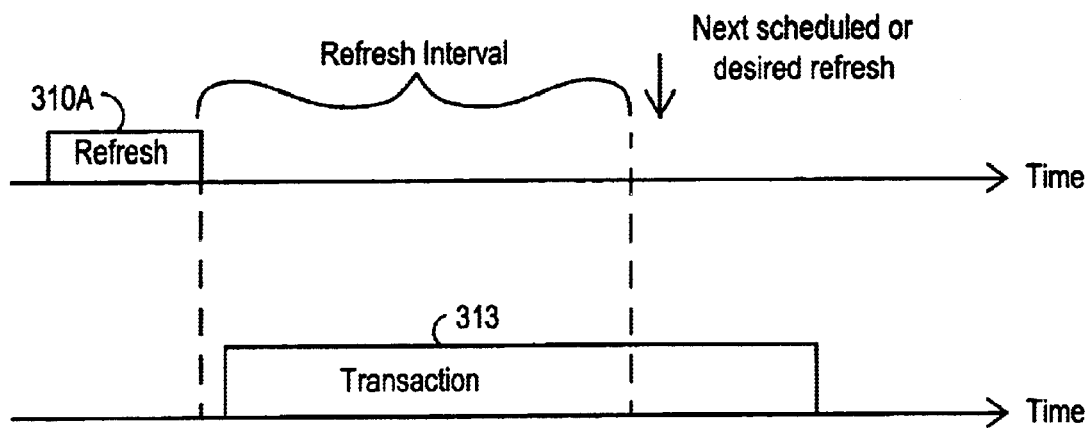
FIG. 11 illustrates another example of a refresh operation for a memory.

FIG. 11 depicts a situation where a timing conflict may arise. More specifically, refresh operation 310A occurs, followed by memory transaction 313 (a memory transaction by controller 130). At the time of the next refresh operation, memory transaction 313 has not concluded and controller 130 has not relinquished ownership of the shared memory interface. As a consequence, controller 133 may not cause the next refresh operation to begin.

To avoid data loss, arbitration circuitry 150 includes mechanisms to provide access to or ownership of the shared memory interface to controller 133 so that it may provide appropriate signal(s) or refresh command(s) to memory/ memories 109B. Another potential conflict may arise where both controller 130 and controller 133 seek ownership of the shared memory interface. Arbitration circuitry 150 uses signal link 156 and signal link 159 (see, for example, FIG. 3) to coordinate ownership of and access to the shared memory interface by controller 130 and controller 133.

Figure 12:
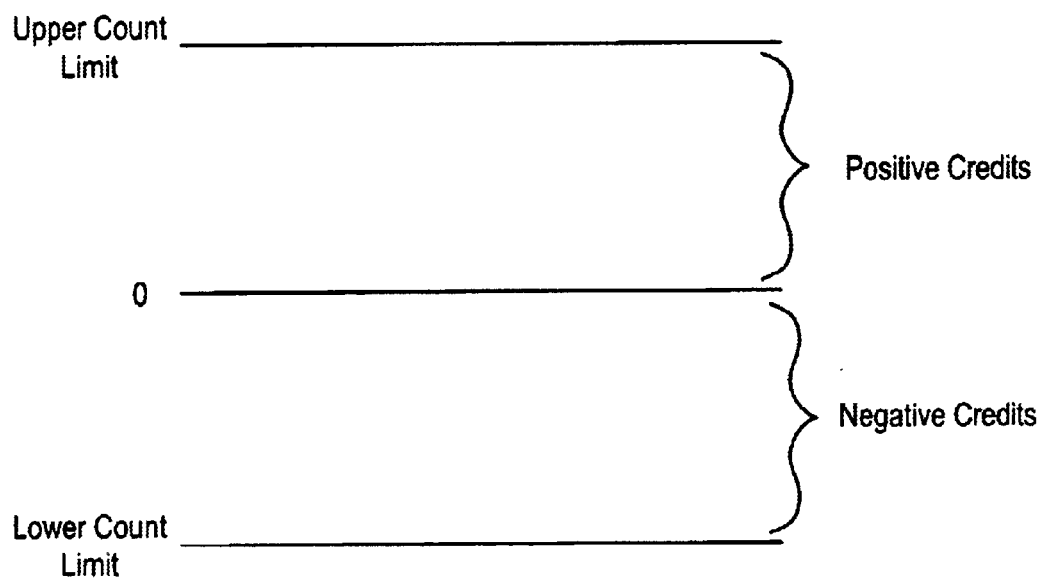
FIG. 12 depicts details of the arbitration of a shared memory interface in an exemplary embodiment according to the invention.

In one scheme, arbitration circuitry 150 uses a counter (not shown explicitly) to arbitrate ownership of the shared memory interface. FIG. 12 illustrates the operation of the counter used to arbitrate ownership of the shared memory interface in an exemplary embodiment according to the invention.

The count value of the counter determines the length of time that controller 130 may have ownership of the shared memory interface and its priority for obtaining the ownership. The counter increments or decrements in response to a clock signal (e.g., a PLD clock signal or a clock signal within memory controller 106), depending on whether controller 130 has ownership of the shared memory interface.

More specifically, arbitration circuitry 150 increments the counter while controller 130 does not have ownership of the shared memory interface until the count value reaches an upper limit. While the count value exceeds zero, controller 130 has positive "credits" and has priority over controller 133 for use of the shared memory interface, unless controller 133 seeks to initiate or conclude a refresh cycle (if applicable).

Depending on whether the status of the refresh operations (scheduled, commenced, etc.) and depending on whether controller 130 seeks or has ownership of the shared interface (for example, through Request signal 156A in FIG. 6), arbitration circuitry 150 may allow ownership of the shared interface by controller 130. If controller 133 seeks to initiate a refresh cycle and controller 130 owns the shared interface, arbitration circuitry 150 commands controller 130 to relinquish ownership of the shared memory interface, as described below in detail.

If controller 133 has already commenced a refresh cycle, arbitration circuitry 150 grants controller 130 access to the shared memory interface at the conclusion of the refresh operation (assuming that controller 130 has requested the shared interface and it has positive "credits," or controller 133 has no outstanding transactions). Arbitration circuitry 150 may do so, for example, by using Grant signal 156C in FIG. 6.

When controller 130 has ownership of the shared memory interface, arbitration circuitry 150 decrements the counter by a number equal to the increment value minus a decrement value. When the count value reaches a lower limit, arbitration circuitry 150 stops decrementing the counter. The lower limit typically depends on the desired refresh interval. A count value of less than zero indicates that controller 130 has no "credits," and that controller 133 has priority over it for ownership of the shared memory interface.

The counter increment, the count decrement, the upper limit, and the lower limit may have fixed or programmable values, as desired. The choice of the values depends on performance and design specifications for a given application or implementation, as persons of ordinary skill in the art who have the benefit of the description of the invention understand.

As noted above, if controller 130 has ownership of the shared memory interface at the time that controller 133 seeks to initiate a refresh operation, arbitration circuitry 150 commands controller 130 to relinquish the shared interface. Arbitration circuitry 150 may do so, for example, by using Release signal 156D in FIG. 6.

When controller 130 has finished its memory transaction (which it may indicate by using Request signal 156A), arbitration circuitry 150 de-asserts Release signal 156D and subsequently de-asserts Grant signal 156C. This sequence of events allows controller 130 and controller 133 to drive the shared memory interface at proper times so that they do not cause any signal contention. Note that arbitration circuitry 150 may also assert Release signal 156D when controller 130 has no positive "credits" and controller 133 has pending transactions, such as refresh operations.

Once controller 130 relinquishes the shared interface, a refresh operation may commence. At the conclusion of the refresh operation, arbitration circuitry 150 may grant ownership to controller 130 depending on various factors (the count value, whether controller 130 seeks ownership of the interface, etc.).

Before relinquishing ownership of the shared interface, controller 130 may save the status of its memory transaction, if any, as desired. Doing so allows controller 130 to resume the memory transaction later, for example, if arbitration circuitry 150 grants it ownership of the shared interface at the conclusion of the refresh operation.

Note that in exemplary embodiments, memory controller 106 or arbitration circuitry 150 may include mechanisms so that refresh operations on average occur at specified or desired intervals. More specifically, individual refresh operations may move forward or backward in time in relation to the specified or desired interval. On average, however, refresh operations occur at the specified or desired intervals so as to avoid loss of data noted above.

Arbitration circuitry 150 includes an indication or measure of the longest time it takes controller 130 to conduct a memory transaction. One may program the longest time for such a memory transaction in a configuration register within arbitration circuitry 150, as desired. One may express or program the time period in terms of the number of clock cycles of controller 133, as desired (controller 133 typically has a higher clock frequency than does controller 130). Controller 133 may include a refresh counter that counts clock cycles and whose count value corresponds to the amount of time between refresh operations. In other words, the count value of the refresh counter resets at the conclusion of each refresh operation.

Arbitration circuitry 150 uses the information about the length of time for the longest memory transaction by controller 130 to detect whether the next refresh operation would fall within the time-span of that transaction. If controller 130 has ownership of, or access to, the shared memory interface and the refresh counter in controller 133 has a count value that corresponds to the refresh interval less the maximum length of memory transaction for controller 130, arbitration circuitry 150 asserts Release signal 156D. In response, controller 130 finishes the then-current memory access and de-asserts Request signal 156A. Controller 133 may subsequently assume ownership of the shared memory interface and perform a refresh operation.

In another situation, controller 130 may request ownership of the shared memory interface when controller 133 has ownership of, or access to, the shared interface. If the refresh counter has a count value that corresponds to the refresh interval less the maximum length of memory transaction for controller 130, arbitration circuitry 150 allows controller 133 to proceed with performing a refresh operation. After the refresh operation concludes, arbitration circuitry 150 grants the shared memory interface to controller 130, assuming that controller 130 has positive "credits" or controller 133 has no pending transactions). This sequence of events in effect pulls the refresh operation forward in time.

Note that using the configuration register and counters constitutes merely one way of implementing this feature in memory controllers according to the invention. As persons of ordinary skill in the art who have the benefit of the description of the invention understand, one may use a variety of other ways, as desired.

Persons of ordinary skill in the art who have the benefit of the description of the invention appreciate that the illustrative embodiments described above constitute mere examples. Because of the flexibility of the inventive concepts, one may design and implement a wide variety of PLDs that include memory controllers and associated interfaces according to the invention, as desired.

For instance, one may use a variety of other arbitration schemes, as desired. The choice and implementation of the arbitration scheme depends on factors such as design and performance specifications, as persons of ordinary skill in the art who have the benefit of the description of the invention understand.

As one example, arbitration circuitry 150 may obtain from controller 130 and controller 133 the length of the memory transactions they seek to perform. Based on that information, and based on whether the memory transactions cause conflicts with any refresh operations, arbitration circuitry 150 may arbitrate ownership of the shared interface.

As another example, arbitration circuitry 150 may implement a round-robin priority scheme. The ownership period of the shared memory interface by controller 130 and controller 133 may be equal or unequal, as desired. Arbitration circuitry 150 may take into account pending, scheduled, or commenced refresh operations, as desired and as appropriate.

Referring to the figures, persons of ordinary skill in the art will note that the various blocks shown may depict mainly the conceptual functions and signal flow. The actual circuit implementation may or may not contain separately identifiable hardware for the various functional blocks. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have the benefit of the description of the invention understand.

Other modifications and alternative embodiments of the invention in addition to those described here will be apparent to persons of ordinary skill in the art who have the benefit of the description of the invention. Accordingly, this description teaches those skilled in the art the manner of carrying out the invention and are to be construed as illustrative only.

The forms of the invention shown and described should be taken as the presently preferred embodiments. Persons skilled in the art may make various changes in the shape, size and arrangement of parts without departing from the scope of the invention described in this document. For example, persons skilled in the art may substitute equivalent elements for the elements illustrated and described here. Moreover, persons skilled in the art who have the benefit of this description of the invention may use certain features of the invention independently of the use of other features, without departing from the scope of the invention.

We claim:

1. A programmable logic device (PLD), comprising:
    a memory controller, comprising:
        a first controller, the first controller configured to communicate via a shared interface with a first memory external to the programmable logic device (PLD);
        a second controller, tile second controller configured to communicate via the shared interface with a second memory external to the programmable logic device (PLD); and
        an arbitration circuitry, the arbitration circuitry configured to arbitrate ownership of the shared interface by the first and second controllers.

2. The programmable logic device (PLD) according to claim 1, wherein the shared interface comprises an address signal, a data signal and a control signal.

3. The programmable logic device (PLD) according to claim 2, wherein the arbitration circuitry communicates with the first controller via a first signal link, and wherein the arbitration circuitry communicates with the second controller via a second signal link.

4. The programmable logic device (PLD) according to claim 3, wherein the second signal link includes at least one status signal and at least one control signal.

5. The programmable logic device (PLD) according to claim 4, wherein the data signal in the shared interface comprises a write data signal.

6. The programmable logic device (PLD) according to claim 5, further comprising:
   a first signal selector, the first signal selector configured to receive a first address signal from the first controller and a second address signal from the second controller, the first signal selector further configured to selectably provide as the address signal one of the first and second address signals;
   a second signal selector, the second signal selector configured to receive a first write data signal from the first controller and a second write data signal from the second controller, the first signal selector further configured to selectably provide as the write data signal one of the first and second write data signals.

7. The programmable logic device (PLD) according to claim 6, further comprising a third signal selector, the third signal selector configured to receive a first control signal from the first controller and a second control signal from the second controller, the third signal selector further configured to selectably provide as the control signal one of the first and second control signals.

8. The programmable logic device (PLD) according to claim 7, wherein the control signal comprises an output-enable signal.

9. The programmable logic device (PLD) according to claim 4, wherein the at least one status signal in the second data link comprises a request signal, and wherein the second controller uses the request signal to request ownership of the shared interface.

10. The programmable logic device (PLD) according to claim 9, wherein the at least one control signal in the second data link comprises a grant signal, and wherein the arbitration circuitry uses the grant signal to grant ownership of the shared interface to the second controller.

11. The programmable logic device (PLD) according to claim 10, wherein the at least one control signal in the second data link further comprises a release signal, and wherein the arbitration circuitry uses the release signal to cause the second controller to relinquish ownership of the shared interface.

12. A data-processing system, comprising:
   a programmable logic device (PLD), comprising:
      a first memory controller, the first memory controller coupled to a first memory external to the programmable logic device (PLD);
      a second memory controller, the second memory controller coupled to a second memory external to the programmable logic device (PLD); and
      a configurable memory interface, the configurable memory interface adapted to selectably provide a shared memory interface configured to provide communication between the first and second controllers and the respective first and second memories.

13. The data-processing system according to claim 12, wherein the configurable memory interface provides a shared memory interface in response to a first state of a share-control signal.

14. The data-processing system according to claim 13, wherein the shared memory interface comprises an address signal, a data signal and a control signal.

15. The data-processing system according to claim 14, wherein the configurable memory interface selectably provides as the address signal of the shared interface one of first and second address signals received from the first and second memory controllers, respectively; and wherein the configurable memory interface selectably provides as the data signal of the shared interface one of first and second write data signals received from the first and second memory controllers, respectively.

16. The data-processing system according to claim 15, wherein the configurable memory interface selectably provides as the control signal of the shared interface one of first and second output-enable signals received from the first and second memory controllers, respectively.

17. The data-processing system according to claim 16, wherein the configurable memory interface arbitrates communication between first and second controllers and the first and second memories, respectively.

18. The data-processing system according to claim 17, wherein the configurable memory interface uses a priority arbitration scheme.

19. The data-processing system according to claim 17, wherein the configurable memory interface uses a round-robin arbitration scheme.

20. The data-processing system according to claim 19, wherein the first memory comprises a dynamic random-access memory (DRAM).

21. The data-processing system according to claim 20, wherein the configurable memory interface is further configured to arbitrate communication between first and second controllers and the first and second memories, respectively, so as to accommodate refreshing the dynamic random-access memory (DRAM).

22. The data-processing system according to claim 21, wherein the first memory comprises a synchronous dynamic random-access memory (SDRAM).

23. The data-processing system according to claim 13, wherein the configurable memory interface provides a non-shared memory interface in response to a second state of the share-control signal.

24. The data-processing system according to claim 23, wherein the shared memory interface further comprises a read data signal, and wherein the configurable memory interface is further configured to selectably provide the read data signal to the second memory controller.

25. The data-processing system according to claim 12, wherein the programmable logic device (PLD) further comprises a processor.

26. The data-processing system according to claim 25, wherein the processor couples to the first memory.

27. The data-processing system according to claim 25, wherein the processor couples o the second memory.

28. The data-processing system according to claim 22, wherein the second memory comprises a read-only memory (ROM).

29. The data-processing system according to claim 22, wherein the second memory comprises a programmable read-only memory (PROM).

30. The data-processing system according to claim 22, wherein the second memory comprises an erasable programmable read-only memory (EPROM).

31. The data-processing system according to claim 22, wherein the second memory comprises a FLASH memory.

32. A method of processing information using a programmable logic device (PLD), the method comprising:
   communicating via a shared interface with a first memory, the first memory being external to the programmable logic device (PLD);
   communicating via the shared interface with a second memory, the second memory being external to the programmable logic device (PLD); and
   arbitrating ownership of the shared interface by the first and second controllers.

33. The method according to claim 32, further comprising communicating via the shared interface an address signal, a data signal and a control signal.

34. The method according to claim 33, wherein communicating via the shared interface with the first memory further comprises communicating via a first signal link, and wherein communicating via the shared interface with the second memory further comprises communicating via a second signal link.

35. The method according to claim 34, wherein communicating via the second signal link further comprises communicating via at least one status signal and at least one control signal.

36. The method according to claim 35, wherein the data signal in the shared interface comprises a write data signal.

37. The method according to claim 36, further comprising:

receiving a first address signal from the first controller and a second address signal from the second controller;

selectably providing as the address signal one of the first and second address signals;

receiving a first write data signal from the first controller and a second write data signal from the second controller, and selectably providing as the write data signal one of the first and second write data signals.

38. The method according to claim 37, further comprising:

receiving a first control signal from the first controller and a second control signal from the second controller; and selectably providing as the control signal one of the first and second control signals.

39. The method according to claim 38, wherein the control signal comprises an output-enable signal.

40. The method according to claim 35, wherein the at least one status signal in the second data link comprises a request signal, the method further comprising using, by the second controller, the request signal to request ownership of the shared interface.

41. The method according to claim 40, wherein the at least one control signal in the second data link comprises a grant signal, the method further comprising using the grant signal to grant ownership of the shared interface to the second controller.

42. The method according to claim 41, wherein the at least one control signal in the second data link further comprises a release signal, the method further comprising using the release signal to cause the second controller to relinquish ownership of the shared interface.

* * * * *

UNITED STATES PATENT AND TRADEMARK OFFICE
CERTIFICATE OF CORRECTION

PATENT NO. : 6,828,822 B1
DATED : December 7, 2004
INVENTOR(S) : Bellis et al.

It is certified that error appears in the above-identified patent and that said Letters Patent is hereby corrected as shown below:

Column 12,
Line 49, delete "tile", and insert -- the --.

Column 14,
Line 45, delete "couples o", and insert -- couples the --.

Signed and Sealed this

Tenth Day of May, 2005

JON W. DUDAS
*Director of the United States Patent and Trademark Office*